(12) United States Patent
Hara et al.

(10) Patent No.: US 9,508,670 B2
(45) Date of Patent: Nov. 29, 2016

(54) SEMICONDUCTOR DEVICE INCLUDING SEMICONDUCTOR CHIPS STACKED VIA RELAY SUBSTRATE

(71) Applicant: SHINKO ELECTRIC INDUSTRIES CO., LTD., Nagano (JP)

(72) Inventors: Koji Hara, Nagano (JP); Yoshihiro Ihara, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 204 days.

(21) Appl. No.: 14/517,993

(22) Filed: Oct. 20, 2014

(65) Prior Publication Data

US 2015/0130053 A1      May 14, 2015

(30) Foreign Application Priority Data

Nov. 8, 2013   (JP) .................. 2013-232448

(51) Int. Cl.
*H01L 23/48*    (2006.01)
*H01L 23/00*    (2006.01)
(Continued)

(52) U.S. Cl.
CPC ............ *H01L 24/17* (2013.01); *H01L 23/147* (2013.01); *H01L 24/73* (2013.01); *H01L 24/92* (2013.01); *H01L 25/0657* (2013.01); *H01L 25/50* (2013.01); *H01L 24/16* (2013.01); *H01L 24/32* (2013.01); *H01L 24/45* (2013.01); *H01L 24/48* (2013.01); *H01L 24/81* (2013.01); *H01L 24/83* (2013.01); *H01L 24/85* (2013.01); *H01L 2224/0401* (2013.01); *H01L 2224/04042* (2013.01); *H01L 2224/05124* (2013.01); *H01L 2224/05139* (2013.01); *H01L 2224/05144* (2013.01); *H01L 2224/05541* (2013.01); *H01L 2224/05568* (2013.01); *H01L 2224/05644* (2013.01); *H01L 2224/05664* (2013.01); *H01L 2224/1134* (2013.01); *H01L 2224/131* (2013.01); *H01L 2224/13144* (2013.01); *H01L 2224/13147* (2013.01); *H01L 2224/16227* (2013.01); *H01L 2224/1703* (2013.01); *H01L 2224/17181* (2013.01); *H01L 2224/2919* (2013.01); *H01L 2224/29101* (2013.01);
(Continued)

(58) Field of Classification Search
CPC ........................................................ H01L 27/02
USPC ........................................................... 257/737
See application file for complete search history.

(56) References Cited

U.S. PATENT DOCUMENTS

2009/0321927 A1* 12/2009 Nishimura .......... H01L 23/3128
                                                                        257/737

FOREIGN PATENT DOCUMENTS

JP        2004-071997        3/2004

*Primary Examiner* — Samuel Gebremariam
(74) *Attorney, Agent, or Firm* — IPUSA, PLLC

(57) ABSTRACT

A semiconductor device includes a support body provided with a wiring layer that includes a first pad; a first semiconductor chip; a first relay substrate stacked on the first semiconductor chip through a first non-conductive adhesion layer and including a first conductive portion and a first protruding electrode electrically connected to the first conductive portion; a second semiconductor chip stacked on the first relay substrate through a second non-conductive adhesion layer, the first protruding electrode of the first relay substrate penetrating the second non-conductive adhesion layer to be connected to the second semiconductor chip; and a first metal wire formed at the first relay substrate to be connected to the first conductive portion for electrically connecting the first conductive portion with the first pad of the wiring layer of the support body.

8 Claims, 6 Drawing Sheets

(51) Int. Cl.
*H01L 25/065* (2006.01)
*H01L 25/00* (2006.01)
*H01L 23/14* (2006.01)

(52) U.S. Cl.
CPC ............... *H01L 2224/32145* (2013.01); *H01L 2224/32225* (2013.01); *H01L 2224/33181* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/48471* (2013.01); *H01L 2224/73104* (2013.01); *H01L 2224/73204* (2013.01); *H01L 2224/73257* (2013.01); *H01L 2224/73265* (2013.01); *H01L 2224/81192* (2013.01); *H01L 2224/83104* (2013.01); *H01L 2224/83138* (2013.01); *H01L 2224/83192* (2013.01); *H01L 2224/83855* (2013.01); *H01L 2224/85205* (2013.01); *H01L 2224/9211* (2013.01); *H01L 2224/92125* (2013.01); *H01L 2224/92165* (2013.01); *H01L 2224/92227* (2013.01); *H01L 2224/92247* (2013.01); *H01L 2225/0651* (2013.01); *H01L 2225/06537* (2013.01); *H01L 2225/06572* (2013.01)

SEMICONDUCTOR DEVICE INCLUDING SEMICONDUCTOR CHIPS STACKED VIA RELAY SUBSTRATE

CROSS-REFERENCE TO RELATED APPLICATION

The present application is based on and claims the benefit of priority of Japanese Priority Application No. 2013-232448 filed on Nov. 8, 2013, the entire contents of which are hereby incorporated by reference.

BACKGROUND OF THE INVENTION

1. Field of the Invention

The present invention relates to a semiconductor device.

2. Description of the Related Art

Conventionally, a semiconductor device is known in which a plurality of semiconductor chips are stacked on a substrate, and the semiconductor chips are connected with wirings formed in the substrate through bonding wires, respectively. Further, it is also known that electrical characteristics may be improved in such a semiconductor device by fixing a back surface of each semiconductor chip at predetermined potential such as ground potential, power supply potential or the like by applying a voltage to the back surface of the semiconductor chip.

In order to fix the back surface of the semiconductor chip at the predetermined potential in such a semiconductor device, for example, a relay substrate on which a conductive film is formed is provided between the adjacent semiconductor chips. At this time, the conductive film formed on the relay substrate and the wiring formed in the substrate are connected with each other through a bonding wire so that the predetermined voltage can be applied to the conductive film formed in the relay substrate from the wiring formed in the substrate. Then, the conductive film formed on the relay substrate and the back surface of the semiconductor chip are bonded through a conductive adhesive agent so that the back surface of the semiconductor chip can be fixed at the predetermined potential (see Patent Document 1, for example).

However, in such a semiconductor device, there is a problem in that electrical loss is large because the conductive adhesive agent is used to bond the back surface of the semiconductor chip to the conductive film formed on the relay substrate for fixing the back surface of the semiconductor chip at the predetermined potential.

Further, as the conductive adhesive agent includes conductive filler, there is a problem in that the adhesion becomes weaker compared with a non-conductive adhesive agent (insulating adhesive agent).

Patent Document

[Patent Document 1] Japanese Laid-open Patent Publication No. 2004-71997

SUMMARY OF THE INVENTION

The present invention is made in light of the above problems, and provides a semiconductor device in which a back surface of a semiconductor chip can be fixed at predetermined potential without using a conductive adhesive agent.

According to an embodiment, there is provided a semiconductor device including a support body provided with a wiring layer that includes a first pad; a first semiconductor chip stacked on the support body; a first relay substrate stacked on the first semiconductor chip through a first non-conductive adhesion layer and including a first conductive portion and a first protruding electrode that is electrically connected to the first conductive portion; a second semiconductor chip, provided with a circuit forming surface on which a circuit is formed and a non-circuit forming surface opposite to the circuit forming surface, stacked on one surface of the first relay substrate through a second non-conductive adhesion layer such that the non-circuit forming surface faces the first relay substrate, the first protruding electrode of the first relay substrate penetrating the second non-conductive adhesion layer to be connected to the non-circuit forming surface of the second semiconductor chip; and a first metal wire formed at the one surface of the first relay substrate to be connected to the first conductive portion for electrically connecting the first conductive portion with the first pad of the wiring layer of the support body.

Note that also arbitrary combinations of the above-described elements, and any changes of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1A:
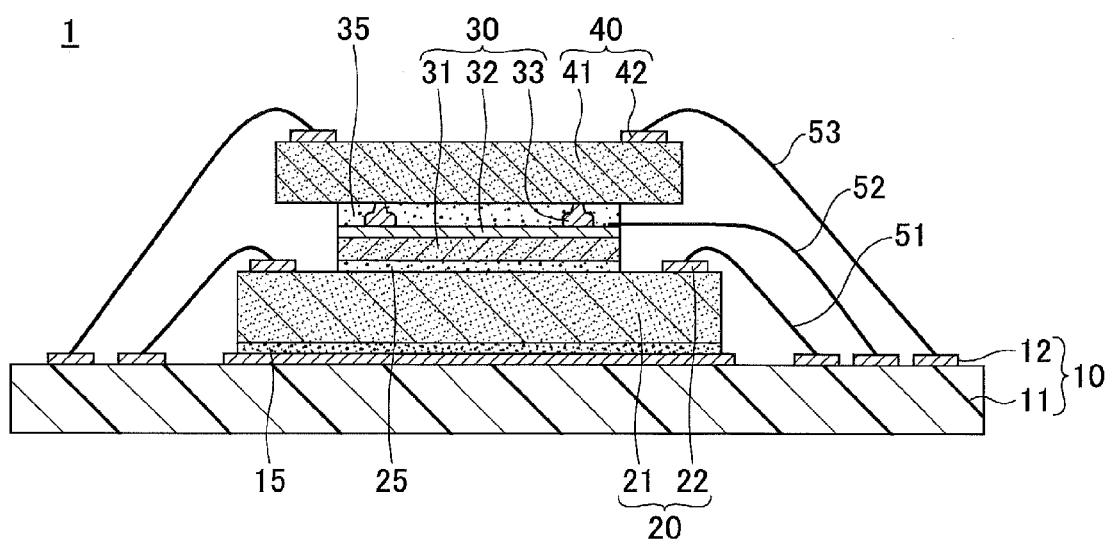
FIG. 1A and FIG. 1B are views illustrating an example of a semiconductor device of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

Structure of Semiconductor Device of First Embodiment

Figure 1B:
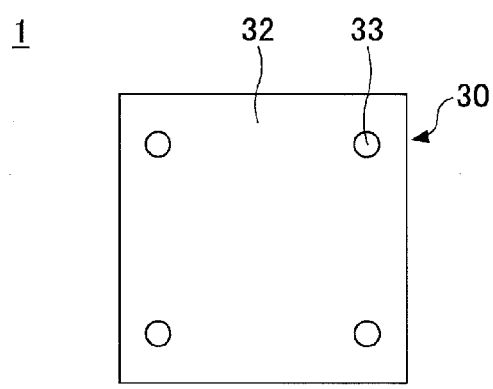

FIG. 1A and FIG. 1B are views illustrating an example of a semiconductor device 1 of the first embodiment. FIG. 1A is a cross-sectional view and FIG. 1B is a plan view only illustrating an example of a first relay substrate 30. With reference to FIG. 1A and FIG. 1B, the semiconductor device 1 includes a support body 10, an adhesion layer 15, a first semiconductor chip 20, an adhesion layer 25 (first non-conductive adhesion layer), the first relay substrate 30, an adhesion layer 35 (second non-conductive adhesion layer), a second semiconductor chip 40 and bonding wires 51 to 53.

In this embodiment, a second semiconductor chip 40 side is referred to as an upper side or one side, and a support body 10 is referred to as a lower side or the other side, for the purpose of explanation. Further, a surface of each component at the second semiconductor chip 40 side is referred to as an upper surface or one surface, and a surface at the support body 10 side is referred to as a lower surface or the other surface. However, the semiconductor device 1 may be used in an opposite direction or may be used at an arbitrarily angle. Further, in this embodiment, "in a plan view" means that an object is seen in a direction that is normal to one surface of the support body 10, and a "plan shape" means a shape of an object seen in the direction that is normal to the one surface of the support body 10.

The support body 10 includes a base member 11 and a wiring layer 12 that is formed on one surface of the base member 11. For the base member 11, a so-called glass epoxy substrate in which insulating resin such as epoxy-based resin or the like is impregnated in a glass cloth may be used, for example. Alternatively, for the base member 11, a flexible board made of polyimide resin, a lead frame made of copper (Cu) or the like, or the like may be used, for example. Further, the base member 11 may be a multilayer wiring board such as a build-up board or the like. The thickness of the base member 11 may be about 0.4 to 2 mm, for example.

For the material of the wiring layer 12, copper (Cu) or the like may be used, for example. The thickness of the wiring layer 12 may be about 10 to 50 μm, for example. The wiring layer 12 includes a chip mounting pad, bonding pads, and the like. In the wiring layer 12, the bonding pads to which the bonding wires 51, 52 and 53 are connected, respectively, are electrically insulated from each other so that the bonding pads are capable of providing different voltages (ground potential, power supply potential, or various signals) through the bonding wires 51, 52 and 53, respectively. A solder resist layer, not illustrated in the drawings, provided with openings that selectively expose parts of the wiring layer 12 may be provided on the one surface of the base member 11.

The first semiconductor chip 20 is provided with a circuit forming surface on which a circuit is formed and a non-circuit forming surface opposite to the circuit forming surface. The first semiconductor chip 20 includes a semiconductor substrate 21 and pads 22 formed on one surface of the semiconductor substrate 21. In the semiconductor substrate 21, a semiconductor integrated circuit is formed. The surface on which the pads 22 are formed is referred to as the circuit forming surface. For the semiconductor substrate 21, a silicon substrate or the like may be used, for example. In this embodiment, the first semiconductor chip 20 is stacked on the support body 10 such that the non-circuit forming surface faces the support body 10, in other words, in a face-up manner. In detail, the first semiconductor chip 20 is adhered on the chip mounting pad of the wiring layer 12 through the adhesion layer 15.

For the material of the pads 22, aluminum (Al), gold (Au), silver (Ag), palladium (Pd) or the like may be used, for example. The thickness of each of the pads 22 may be about 0.5 to 10 μm, for example. The pads 22 are connected to the bonding pads of the wiring layer 12 through the bonding wires 51, respectively. The bonding wires 51 may be metal wires made of gold (Au), copper (Cu), aluminum (Al) or the like, for example.

The adhesion layer 15 may be obtained by curing epoxy-based adhesive agent, for example. The adhesion layer 15 may be conductive or non-conductive. However, if it is necessary to apply a predetermined voltage (ground potential, power supply potential or the like) to the back surface (non-circuit forming surface) of the first semiconductor chip 20 through the wiring layer 12, the adhesion layer 15 may be conductive.

The first relay substrate 30 is stacked on the first semiconductor chip 20. In detail, the first relay substrate 30 is adhered on the circuit forming surface of the first semiconductor chip 20 through the adhesion layer 25. The first relay substrate 30 includes a base member 31, a first conductive portion 32 formed on one surface of the base member 31 and first protruding electrodes 33 electrically connected to the first conductive portion 32.

For the base member 31, a silicon substrate or the like may be used, for example. Alternatively, for the base member 31, a resin substrate, a glass substrate or the like may be used. The thickness of the base member 31 may be about 100 to 500 μm, for example. When the thickness of the base member 31 is more than or equal to 100 μm, it is easy to form the bonding wire 52.

The first conductive portion 32 is a metal film (conductive layer) stacked on the one surface of the base member 31. For the material of the metal film, gold (Au), aluminum (Al) or the like may be used, for example. The thickness of the first conductive portion 32 may be about 0.5 to 10 μm, for example. The first conductive portion 32 may be formed on the entirety of the one surface of the base member 31, or may be selectively formed (patterned) on the one surface of the base member 31 such that the first conductive portion 32 is capable of electrically connecting the first protruding electrodes 33 and the bonding wire 52. The first conductive portion 32 is electrically connected to the bonding pad (a first pad) of the wiring layer 12 through the bonding wire 52 (first metal wire) that is bonded at an outer edge portion of the first conductive portion 32. The bonding wire 52 is a metal wire made of gold (Au), copper (Cu), aluminum (Al) or the like, for example.

The bonding wire 52 extends in a substantially horizontal direction from the outer edge portion of the first conductive portion 32 and then curved toward the support body 10. With this configuration, it is possible to make a size of the plan shape of the second semiconductor chip 40 larger than that of the first relay substrate 30 because a possibility can be decreased that the bonding wire 52 and the back surface of the second semiconductor chip 40 contact with each other. Alternatively, the size of the plan shape of the second semiconductor chip 40 may be smaller than or equal to that of the first relay substrate 30. A method of forming the bonding wire 52 as illustrated in FIG. 1A will be explained later.

The first protruding electrodes 33 are formed on the one surface of the first conductive portion 32 so as to protrude toward the second semiconductor chip 40 side. The number of the first protruding electrodes 33 may be arbitrarily determined (at least one) and the arrangement of the first protruding electrodes 33 may also be arbitrarily determined. However, as an example, as illustrated in FIG. 1B, four of the first protruding electrodes 33 may be arranged at four corners of the one surface of the first conductive portion 32. For the first protruding electrodes 33, gold bumps, solder bumps, copper posts or the like may be used, for example. The height of each of the first protruding electrodes 33 may be about 20 to 70 μm, for example. Further, the shape of each of the first protruding electrodes 33 may also be arbitrarily determined. However, as an example, as illustrated in FIG. 1A, each of the first protruding electrodes 33 may be a bump that includes a larger portion at which the diameter is larger and a smaller portion at which the diameter is smaller.

Figure 2:
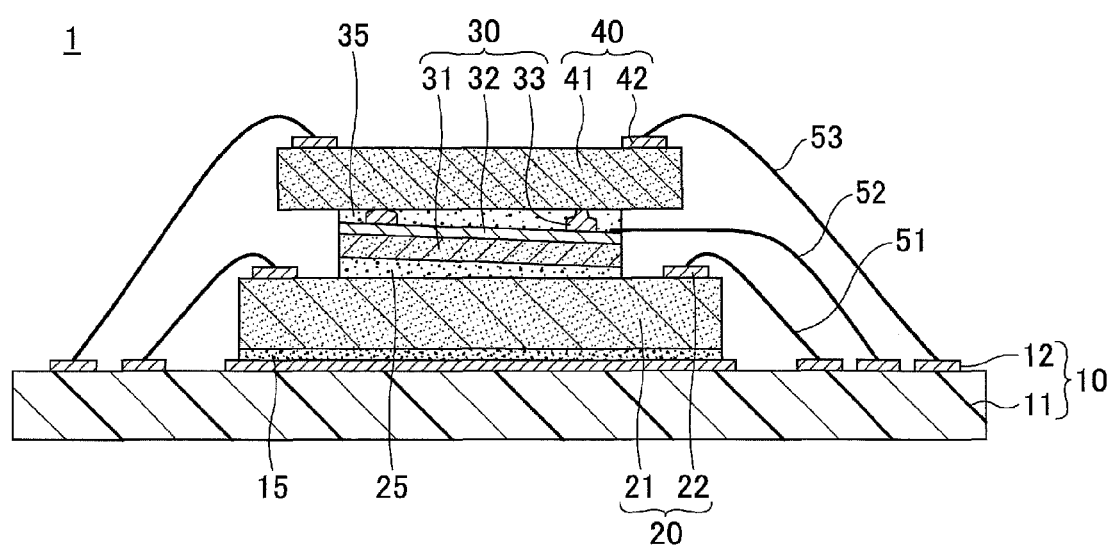
FIG. 2 is a view for explaining a case when a relay substrate is inclined when mounting the relay substrate.

By placing the first protruding electrodes 33 at the four corners of the one surface of the first conductive portion 32, the following advantages can be obtained. Even if the first relay substrate 30 is inclined when being mounted on the first semiconductor chip 20, as illustrated in FIG. 2, the first protruding electrodes 33 can absorb the inclination of the first relay substrate 30 while being smashed when the second semiconductor chip 40 is mounted on the first relay substrate 30. Further, the first protruding electrodes 33 can be support portions that can retain the second semiconductor chip 40 to be positioned in a horizontal direction by being smashed. Thus, the first protruding electrodes 33 have a function to apply voltage to the second semiconductor chip 40 and also a function to retain the second semiconductor chip 40 to be positioned in a horizontal direction. Thus, the first protruding electrodes 33 can make it easy to form the bonding wires 53 or contribute to improve the uniformity in the total height of the semiconductor device 1.

In detail, by using the bump including the larger portion and the smaller portion as each of the first protruding electrodes 33, even when the first relay substrate 30 is inclined when being mounted on the first semiconductor chip 20, the first protruding electrodes 33 can absorb the inclination of the first relay substrate 30. This means that, when mounting the second semiconductor chip 40 on the first relay substrate 30, at a portion at which the distance between the first relay substrate 30 and the second semiconductor chip 40 becomes short (left side in FIG. 2), the smaller portion of each of the first protruding electrodes 33 is smashed so that the length of the respective protruding electrode 33 becomes short as well.

Meanwhile, as the larger portion of each of the first protruding electrodes 33 is hard to be smashed, the first protruding electrode 33 is not smashed to be shorter than the height of the larger portion. Thus, a height necessary for forming the bonding wire 52 can be ensured.

On the other hand, at a portion at which the distance between the first relay substrate 30 and the second semiconductor chip 40 becomes long (right side in FIG. 2), the respective protruding electrode 33 contacts the second semiconductor chip 40 without being smashed even at the smaller portion. Thus, even when the first relay substrate 30 is inclined when being mounted, the first relay substrate 30 can support the second semiconductor chip 40 to be stacked on the first semiconductor chip 20 while retaining their positions in the horizontal direction.

The adhesion layer 25 may be obtained by curing epoxy-based adhesive agent, for example. In order to avoid the electrical connection between the semiconductor substrate 21 and the first conductive portion 32 through the base member 31, the adhesion layer 25 is formed as a non-conductive adhesion layer.

The second semiconductor chip 40 is provided with a circuit forming surface on which a circuit is formed and a non-circuit forming surface opposite to the circuit forming surface. The second semiconductor chip 40 includes a semiconductor substrate 41 in which a semiconductor integrated circuit is formed and pads 42 formed on one surface of the semiconductor substrate 41. The surface on which the pads 42 are formed is referred to as the circuit forming surface. For the semiconductor substrate 41, a silicon substrate or the like may be used, for example. In this embodiment, the second semiconductor chip 40 is adhered on the first relay substrate 30 such that the non-circuit forming surface faces the first relay substrate 30, in other words, in a face-up manner through the adhesion layer 35.

For the material of the pads 42, gold (Au) or the like may be used, for example. The thickness of each of the pads 42 may be about 0.5 to 10 μm, for example. The pads 42 are connected to the bonding pads of the wiring layer 12 through the bonding wires 53, respectively. The bonding wires 53 may be a metal wire made of gold (Au), copper (Cu), aluminum (Al) or the like, for example.

The first protruding electrodes 33 are formed to penetrate the adhesion layer 35 and upper end surfaces of the first protruding electrodes 33 contact the back surface (non-circuit forming surface) of the second semiconductor chip 40 so that they are electrically connected with each other. This means that it is possible to apply a predetermined voltage (ground potential, power supply potential or the like) from the wiring layer 12 of the support body 10 to the back surface of the second semiconductor chip 40 through the bonding wire 52, the first conductive portion 32 and the first protruding electrodes 33. By fixing the voltage of the back surface of the second semiconductor chip 40 at the predetermined potential, electrical characteristic of the second semiconductor chip 40 can be improved.

The semiconductor chips, for each of which the back surface is fixed at a predetermined potential, are so-called analog chips (including analog circuits as main components).

The adhesion layer 35 is obtained by curing epoxy-based adhesive agent, for example. The adhesion layer 35 is a non-conductive adhesion layer. Even when a conductive adhesion layer is used as the adhesion layer 35, there may be no problem in electrical functions. However, as the adhesion becomes lower for the electrically conductive adhesive agent compared with non-conductive adhesive agent, in this embodiment, the adhesion layer 35 is obtained by curing non-conductive adhesive agent.

Method of Manufacturing Semiconductor Device of First Embodiment

FIG. 3A to FIG. 4C are views illustrating an example of a method of manufacturing the semiconductor device 1 of the first embodiment. First, in steps illustrated in FIG. 3A to FIG. 3D, the first relay substrate 30 is manufactured.

Figure 3A:
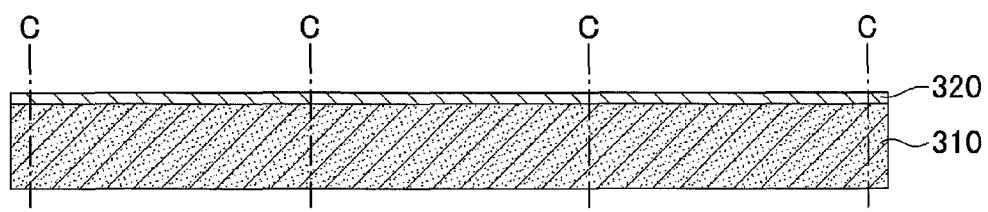
FIG. 3A to FIG. 3D are views illustrating an example of a manufacturing method of the semiconductor device of the first embodiment.

Specifically, as illustrated in FIG. 3A, a silicon wafer 310 is prepared. The silicon wafer 310 becomes the base member 31 after being individualized. Alternatively, instead of using the silicon wafer, a resin substrate, a glass substrate or the like may be used. At this time, the silicon wafer 310 is not thinned yet and the thickness of the silicon wafer 310 may be about 600 to 800 μm, for example.

Here, "C" indicates positions at which the silicon wafer 310 or the like is cut (hereinafter, referred to as a cut position "C"). The silicon wafer 310 is sectioned into a plurality of areas by the cut positions "C" each becomes the first relay substrate 30 having a rectangular shape as illustrated in FIG. 1B.

Next, a metal film 320 is formed on one surface of the silicon wafer 310 by sputtering or the like. The metal film 320 becomes the first conductive portion 32 after being individualized. For the material of the metal film 320, gold (Au), aluminum (Al) or the like may be used, for example.

The thickness of the metal film 320 may be about 0.5 to 10 µm, for example. The metal film 320 may be formed on the entirety of the one surface of the silicon wafer 310, or may be selectively formed (patterned) on the one surface of the silicon wafer 310 such that the metal film 320 (the first conductive portion 32) is capable of electrically connecting the first protruding electrodes 33 and the bonding wire 52 in the later processes.

Figure 3B:
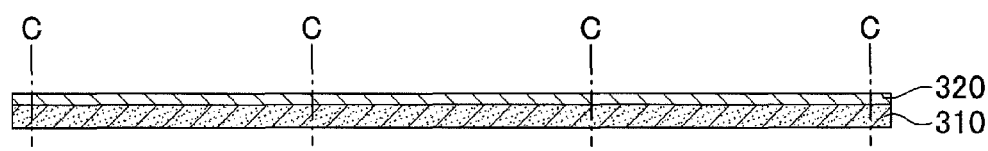

Next, as illustrated in FIG. 3B, the silicon wafer 310 is grinded to be thin from the other surface side using a backside grinder or the like. The thickness of the silicon wafer 310 after being grinded may be about 100 to 500 µm, for example.

Figure 3C:
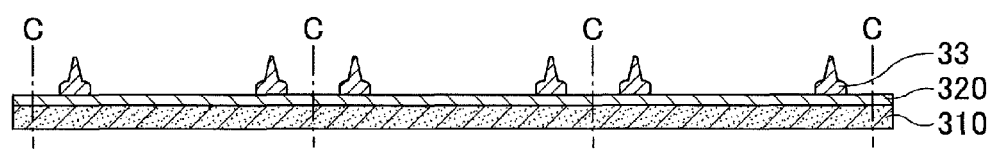

Next, as illustrated in FIG. 3C, the first protruding electrodes 33 are formed at four corners of each of the areas sectioned by the cut positions "C" on the one surface of the metal film 320, for example. For the first protruding electrodes 33, gold bumps, solder bumps, copper posts or the like may be used, for example. When the gold bump is used for each of the first protruding electrodes 33, the gold bump may be formed on the one surface of the metal film 320 using a wire bonder. Here, as the first protruding electrodes 33 are pushed in the following step illustrated in FIG. 4C, the height of each of the first protruding electrodes 33 may be made higher than the designed height (the height after the step illustrated in FIG. 4C) in the final product.

Figure 3D:
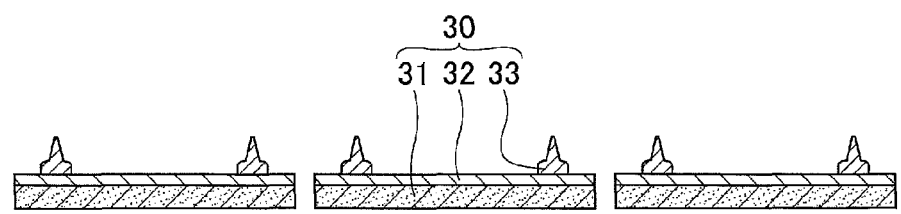

Next, as illustrated in FIG. 3D, the silicon wafer 310 on which the metal film 320 and the first protruding electrodes 33 are formed, is individualized by cutting at the cut positions "C" by dicing or the like, for example. With this configuration, the base member 31 and the first conductive portion 32 are formed from the silicon wafer 310 and the metal film 320 and a plurality of the relay substrates 30 are obtained.

Figure 4A:
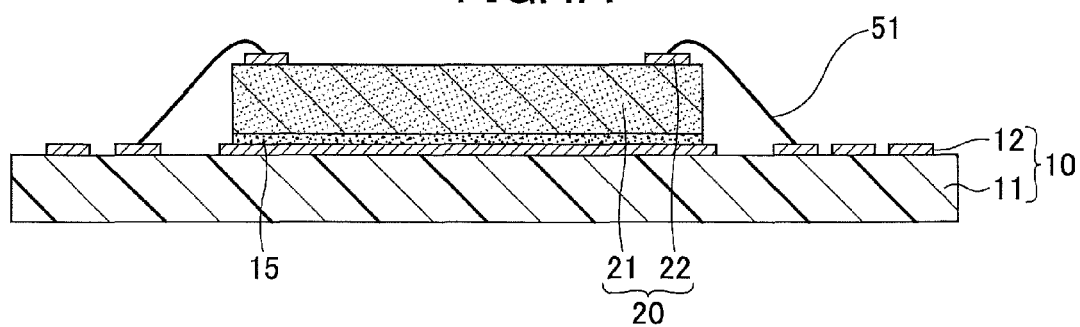
FIG. 4A to FIG. 4C are views illustrating an example of a manufacturing method of the semiconductor device of the first embodiment.

Next, in a step illustrated in FIG. 4A, the support body 10 including the base member 11 and the wiring layer 12 is prepared. For the base member 11, a so-called glass epoxy substrate in which insulating resin such as epoxy-based resin or the like is impregnated in a glass cloth may be used, for example. Alternatively, for the base member 11, a flexible board made of polyimide resin, a lead frame made of copper (Cu) or the like, or the like may be used, for example. Further, the base member 11 may be a multilayer wiring board such as a build-up board or the like. The thickness of the base member 11 may be about 0.4 to 2 mm, for example.

Next, the first semiconductor chip 20 including the semiconductor substrate 21 and the pads 22 is stacked on the chip mounting pad of the wiring layer 12 of the support body 10 in a face-up manner through the adhesion layer 15. The adhesion layer 15 may be obtained by curing epoxy-based adhesive agent, for example. The adhesion layer 15 may be conductive or non-conductive. However, if it is necessary to apply a predetermined voltage (ground potential, power supply potential or the like) to the back surface (non-circuit forming surface) of the first semiconductor chip 20 through the wiring layer 12, the adhesion layer 15 needs to be conductive.

Next, the pads 22 of the first semiconductor chip 20 and the bonding pads of the wiring layer 12 are connected with each other through the bonding wires 51, respectively, using a wire bonder, for example. For the bonding wires 51, metal wires made of gold (Au), copper (Cu), aluminum (Al) or the like may be used, for example.

Figure 4B:
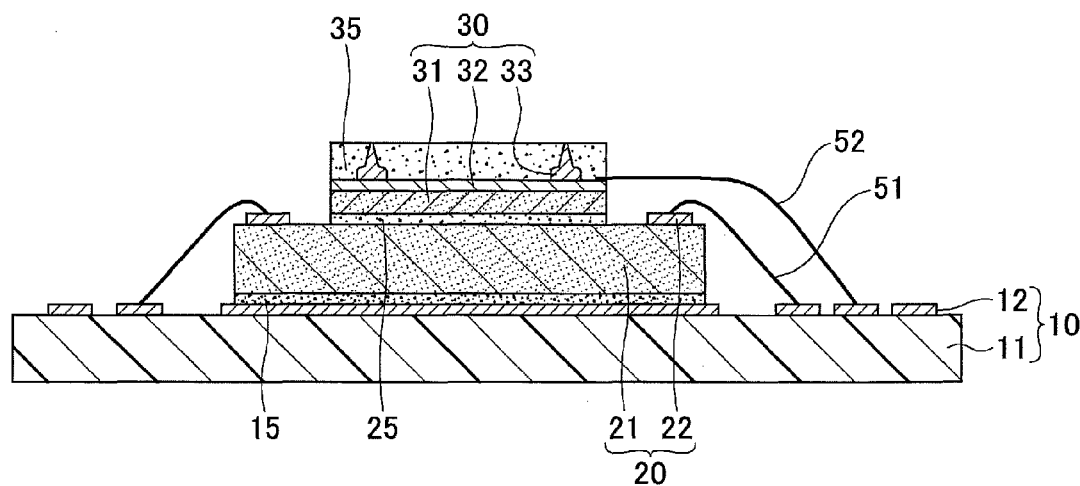

Next, in a step illustrated in FIG. 4B, the first relay substrate 30 manufactured by the steps illustrated in FIG. 3A to FIG. 3D is adhered to the circuit forming surface of the first semiconductor chip 20 through the adhesion layer 25.

The adhesion layer 25 may be obtained by curing epoxy-based adhesive agent, for example. In order to avoid the electrical connection between the semiconductor substrate 21 and the first conductive portion 32 through the base member 31, the adhesion layer 25 is formed as a non-conductive adhesion layer.

Next, the first conductive portion 32 and the bonding pad of the wiring layer 12 are connected through the bonding wire 52 using a wire bonder, for example. For the bonding wire 52, a metal wire made of gold (Au), copper (Cu), aluminum (Al) or the like may be used, for example.

As described above, the bonding wire 52 extends in a substantially horizontal direction from the outer edge portion of the first conductive portion 32 and then curved toward the support body 10. With this configuration, it is possible to make a size of the plan shape of the second semiconductor chip 40 larger than that of the first relay substrate 30 because a possibility can be decreased that the bonding wire 52 and the back surface of the second semiconductor chip 40 contact with each other. In order to form the bonding wire 52 to have the shape as illustrated in FIG. 4B, wire bonding may be performed from the wiring layer 12 side.

This means that a bonding ball that is formed at a front end portion of a bonding wire is contacted at an upper surface of a bonding pad of the wiring layer and a predetermined load is applied by a capillary while applying ultrasonic. With this configuration, an end of the bonding wire 52 is formed on the upper surface of the respective bonding pad of the wiring layer 12. Next, the capillary is moved upward to a position at substantially the same height as the upper surface of the first conductive portion 32, and the capillary is horizontally moved in the vicinity of the outer edge portion of the first conductive portion 32. Then, a portion, which becomes another end of the bonding wire 52, is bonded at the outer edge portion of the first conductive portion 32 and an unnecessary part is cut. This method is referred to as a reverse bonding. When the size of the plan shape of the second semiconductor chip 40 is smaller than that of the first relay substrate 30, it is unnecessary to perform the reverse bonding.

Next, epoxy-based thermosetting adhesive agent or the like, that becomes the adhesion layer 35 after being cured, is coated on the first relay substrate 30 so as to cover the first protruding electrodes 33. At this time, the adhesive agent is not cured yet.

Figure 4C:
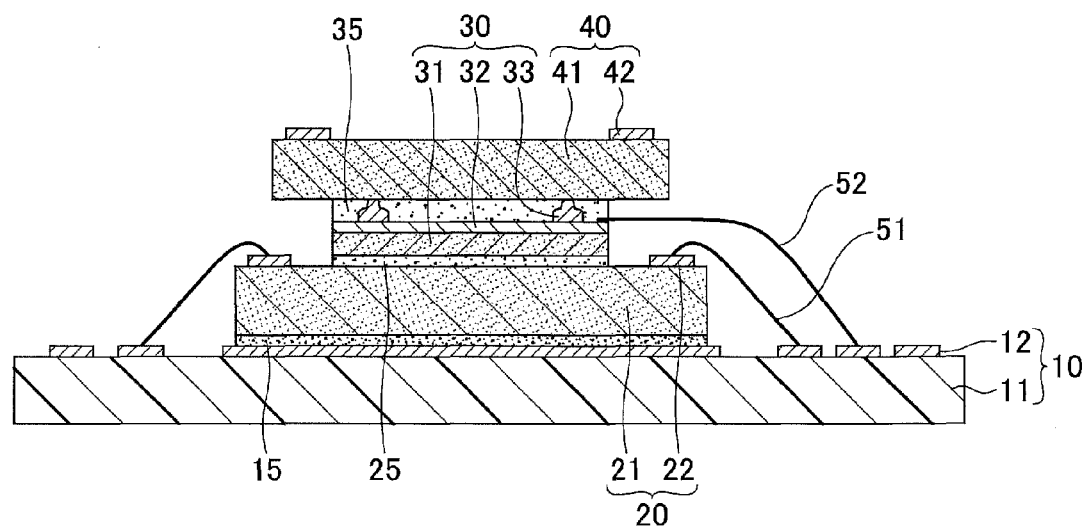

Next, in a step illustrated in FIG. 4C, the second semiconductor chip 40 including the semiconductor substrate 41 and the pads 42 is stacked on the first relay substrate 30 in a face-up manner through the epoxy-based thermosetting adhesive agent or the like, for example. Then, the adhesion layer 35 is formed by curing the epoxy-based thermosetting adhesive agent or the like while heating the epoxy-based thermosetting adhesive agent or the like and pushing the second semiconductor chip 40 toward the first relay substrate 30 side. By pushing the second semiconductor chip 40 toward the first relay substrate 30 side, the front edge portion of each of the first protruding electrodes 33 is smashed and the upper end surface of each of the first protruding electrodes 33 contacts the back surface (non-circuit forming surface) of the second semiconductor chip 40. With this configuration, the first protruding electrodes 33 and the second semiconductor chip 40 are electrically connected with each other.

Here, the adhesion layer 35 is a non-conductive adhesion layer. Even when a conductive adhesion layer is used as the adhesion layer 35, there may be no problem in electrical functions. However, as the adhesion becomes lower for the electrically conductive adhesive agent compared with non-conductive adhesive agent, in this embodiment, the adhesion layer 35 is obtained by curing non-conductive adhesive agent.

After the step illustrated in FIG. 4C, for example, by connecting the pads 42 of the second semiconductor chip 40 with the bonding pads of the wiring layer 12 through the bonding wires 53, respectively, using a wire bonder, the semiconductor device 1 (see FIG. 1A and FIG. 1B) is formed. For the bonding wires 53, metal wires made of gold (Au), copper (Cu), aluminum (Al) or the like may be used, for example.

As such, according to the semiconductor device 1 of the first embodiment, as it is possible to use the non-conductive adhesive agent as the adhesion layer 35, without using the electrically conductive adhesive agent, the electrical loss can be reduced and the adhesion to an object to be adhered can be sufficiently ensured.

In the semiconductor device 1 of the first embodiment, the first protruding electrodes 33 that are connected to the first conductive portion 32 are used to apply voltage to the back surface of the second semiconductor chip 40. Thus, different from the conventional semiconductor device, it is unnecessary to use a conductive adhesion layer whose electrical conductivity is low. Thus, the voltage can be effectively applied to the back surface of the second semiconductor chip 40 and the electrical loss can be reduced.

Further, when the first conductive portion 32 is formed on the entirety of the base member 31, the bonding wire 52 can be bonded at any place of the first conductive portion 32. Thus, degree of freedom in forming the bonding wire 52 can be improved. In the conventional semiconductor device, a bonding wire can be only formed on a previously formed pad.

Further, by using the bump including the larger portion and the smaller portion as each of the first protruding electrodes 33, even when the first relay substrate 30 is inclined when being mounted on the first semiconductor chip 20, the inclination of the first relay substrate 30 can be absorbed. This means that, when mounting the second semiconductor chip 40 on the first relay substrate 30, the smaller portion of the first protruding electrode 33 is smashed at a portion at which the distance between the first relay substrate 30 and the second semiconductor chip 40 becomes short. Meanwhile, as the larger portion of the first protruding electrode 33 is hard to be smashed, the first protruding electrode 33 is not smashed to be shorter than the height of the larger portion. Thus, a height necessary for forming the bonding wire 52 can be ensured.

On the other hand, at a portion at which the distance between the first relay substrate 30 and the second semiconductor chip 40 becomes long, the first protruding electrode 33 contacts the second semiconductor chip 40 without being smashed even at the smaller portion. Thus, even when the first relay substrate 30 is inclined when being mounted, the first relay substrate 30 can support the second semiconductor chip 40 to be stacked on the first semiconductor chip 20 while retaining their positions in the horizontal direction.

Further, as a predetermined voltage is applied to the back surface of the semiconductor chip through an adhesion layer in the conventional semiconductor device, it is necessary to use an expensive conductive adhesion layer. On the other hand, in this embodiment, the back surface of the second semiconductor chip 40 contacts the upper end surfaces of the first protruding electrodes 33 and the predetermined voltage is applied to the back surface of the second semiconductor chip 40 through the first protruding electrodes 33. Thus, it is unnecessary to make the adhesion layer 35 conductive. As a result, as it is possible to use cheap non-conductive adhesive agent, without using expensive electrically conductive adhesive agent, the semiconductor device 1 can be manufactured with lower cost.

Alternative Example of First Embodiment

In an alternative example of the first embodiment, an example is explained in which a relay substrate different from that of the first embodiment is used. The same components as explained in the above embodiments are given the same reference numerals in this example.

Figure 5:
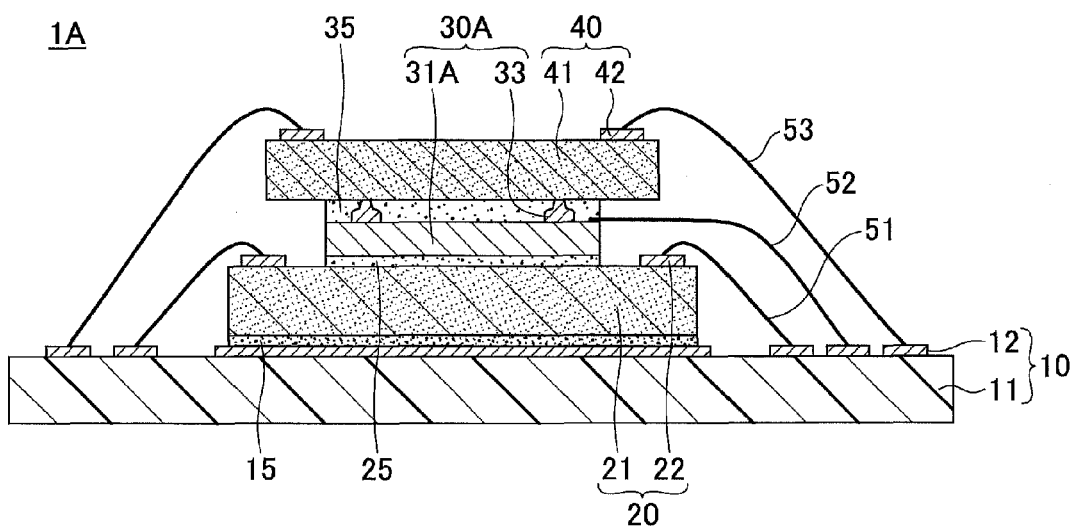
FIG. 5 is a cross-sectional view illustrating an example of a semiconductor device of an alternative example of the first embodiment.

FIG. 5 is a cross-sectional view illustrating an example of a semiconductor device 1A of an alternative example of the first embodiment. With reference to FIG. 5, the semiconductor device 1A of the alternative example of the first embodiment is different from the semiconductor device 1 of the first embodiment (see FIG. 1A and FIG. 1B) in that the first relay substrate 30 is substituted by a first relay substrate 30A.

The first relay substrate 30A is adhered on the circuit forming surface of the first semiconductor chip 20 through the adhesion layer 25. The first relay substrate 30A includes a metal plate 31A and the first protruding electrodes 33 that are electrically connected to the metal plate 31A. For the metal plate 31A, an aluminum plate, a copper plate or the like may be used, for example. The thickness of the metal plate 31A may be about 100 to 500 μm, for example. Plating or the like may be performed on surfaces of the metal plate 31A. The metal plate 31A functions as the first conductive portion of the first relay substrate 30A.

The first relay substrate may have a function to relay the voltage to be applied to the back surface of the second semiconductor chip 40. Thus, the first relay substrate may have a structure as the first relay substrate 30 (see FIG. 1A and FIG. 1B) in which the first conductive portion 32 is formed on the base member 31 made of an insulating material or a semiconductor material and then the first protruding electrodes 33 are provided on the first conductive portion 32, or may have a structure as the first relay substrate 30A in which the first protruding electrodes 33 are directly provided on the metal plate 31A (conductive portion). In such a case, the same advantages as the first embodiment can be obtained as well.

Second Embodiment

In the second embodiment, an example is explained in which a voltage same as that applied to the back surface of the second semiconductor chip 40 is also applied to the back surface of the first semiconductor chip 20. The same components as explained in the above embodiments are given the same reference numerals in the second embodiment.

Figure 6:
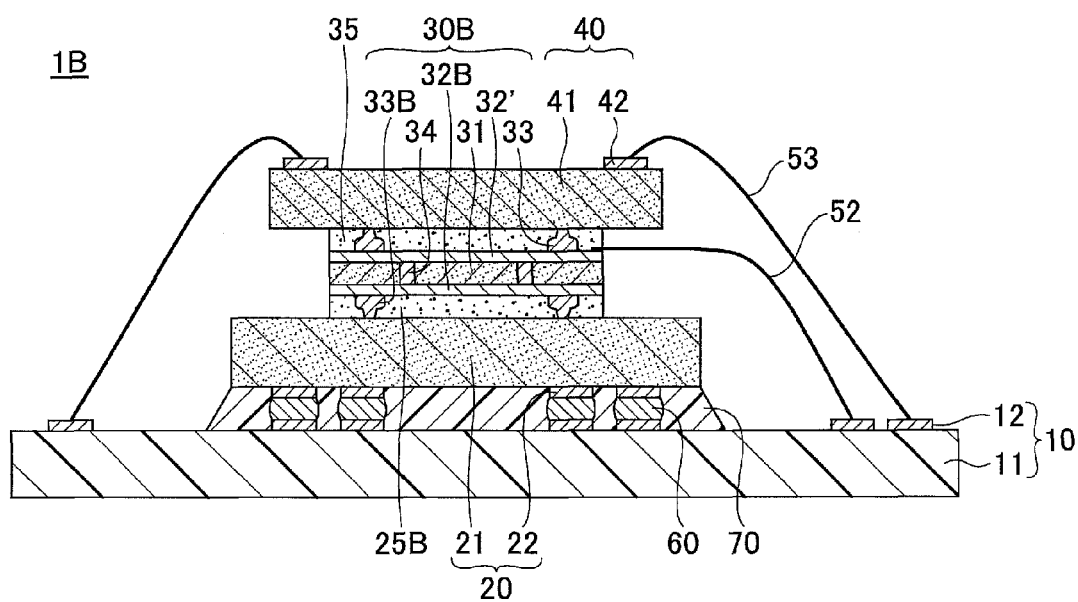
FIG. 6 is a cross-sectional view illustrating an example of a semiconductor device of a second embodiment.

FIG. 6 is a cross-sectional view illustrating an example of a semiconductor device 1B of the second embodiment. With reference to FIG. 6, the semiconductor device 1B of the second embodiment is different from the semiconductor device 1 of the first embodiment (see FIG. 1A and FIG. 1B) in that the first semiconductor chip 20 is flip-chip mounted on the support body 10. Further, the semiconductor device 1B is different from the semiconductor device 1 of the first embodiment (see FIG. 1A and FIG. 1B) in that the adhesion layer 25 and the first relay substrate 30 are substituted by an adhesion layer 25B (first non-conductive adhesion layer) and a first relay substrate 30B.

The first semiconductor chip 20 is stacked on the support body 10 such that the circuit forming surface faces the support body 10, in other words, in a face-down manner. The pads 22 of the first semiconductor chip 20 are electrically connected with the chip mounting pad(s) of the wiring layer 12 through bumps 60. For the bumps 60, solder bumps or the like may be used, for example. Underfill resin 70 is filled between a space between the first semiconductor chip 20 and the support body 10 so as to cover the bumps 60.

The first relay substrate 30B includes the base member 31, the first conductive portion 32, the first protruding electrodes 33, and second protruding electrodes 33B. In this embodiment, the first conductive portion 32 includes a first conductive layer 32' and a second conductive layer 32B formed at both surfaces of the base member 31, and through electrodes 34 (at least one) that is formed in the base member 31 to penetrate the base member 31. Specifically, the first conductive layer 32' is formed on the one surface of the base member 31 and corresponds to the first conductive portion 32 of the first embodiment illustrated in FIG. 1A or the like. The second conductive layer 32B is formed on the other surface of the base member 31. The first conductive layer 32' and the second conductive layer 32B are electrically connected with each other through the through electrodes 34. As a result, the first protruding electrodes 33 and the second protruding electrodes 33B are electrically connected with each other. The material, the shape or the like of the second conductive layer 32B and the second protruding electrodes 33B may be the same as that of the first conductive portion 32 and the first protruding electrodes 33 of the first embodiment, for example. For the material of the through electrodes 34, copper (Cu) or the like may be used, for example.

The first relay substrate 30B is stacked on the first semiconductor chip 20 such that the second conductive layer 32B and the second protruding electrodes 33B are facing toward the back surface of the first semiconductor chip 20 side through the adhesion layer 25B. The adhesion layer 25B is obtained by curing epoxy-based adhesive agent, for example.

The adhesion layer 25B is a non-conductive adhesion layer. Even when a conductive adhesion layer is used as the adhesion layer 25B, there may be no problem in electrical functions. However, as the adhesion is lower for the electrically conductive adhesive agent compared with non-conductive adhesive agent, in this embodiment, the adhesion layer 25B is obtained by curing non-conductive adhesive agent.

The second protruding electrodes 33B penetrate the adhesion layer 25B, and the lower end surfaces of the second protruding electrodes 33B contact the back surface (non-circuit forming surface) of the first semiconductor chip 20 so that they are electrically connected with each other. This means that the predetermined voltage can be applied to the back surface of the first semiconductor chip 20 from the wiring layer 12 of the support body 10 through the bonding wire 52, the first conductive layer 32', the through electrodes 34, the second conductive layer 32B and the second protruding electrodes 33B. This means that the voltage same as that applied to the back surface of the second semiconductor chip 40 can be applied to the back surface of the first semiconductor chip 20.

In this embodiment, as the back surface of the second semiconductor chip 40 contacts the upper end surfaces of the first protruding electrodes 33 and the predetermined voltage can be applied to the back surface of the second semiconductor chip 40 through the first protruding electrodes 33.

Further, as the back surface of the first semiconductor chip 20 contacts the lower end surfaces of the second protruding electrodes 33B, and the predetermined voltage can be applied to the back surface of the first semiconductor chip 20 through the second protruding electrodes 33B. Thus, it is unnecessary to make the adhesion layers 35 and 25B conductive.

As such, in this embodiment, as non-conductive adhesive agent can be used as the adhesion layers 35 and 25B, without using electrically conductive adhesive agent, the same advantages as the first embodiment can be obtained.

Here, instead of using the first conductive layer 32', the through electrodes 34 and the second conductive layer 32B, a single metal plate may be used as the first conductive portion 32 and the protruding electrodes 33 may be provided at an upper surface of the metal plate and the second protruding electrodes 33B may be provided at a lower surface of the metal plate.

Third Embodiment

In the third embodiment, an example is explained in which a voltage different from that applied to the back surface of the second semiconductor chip 40 is applied to the back surface of the first semiconductor chip 20. The same components as explained in the above embodiments are given the same reference numerals in the third embodiment.

Figure 7:
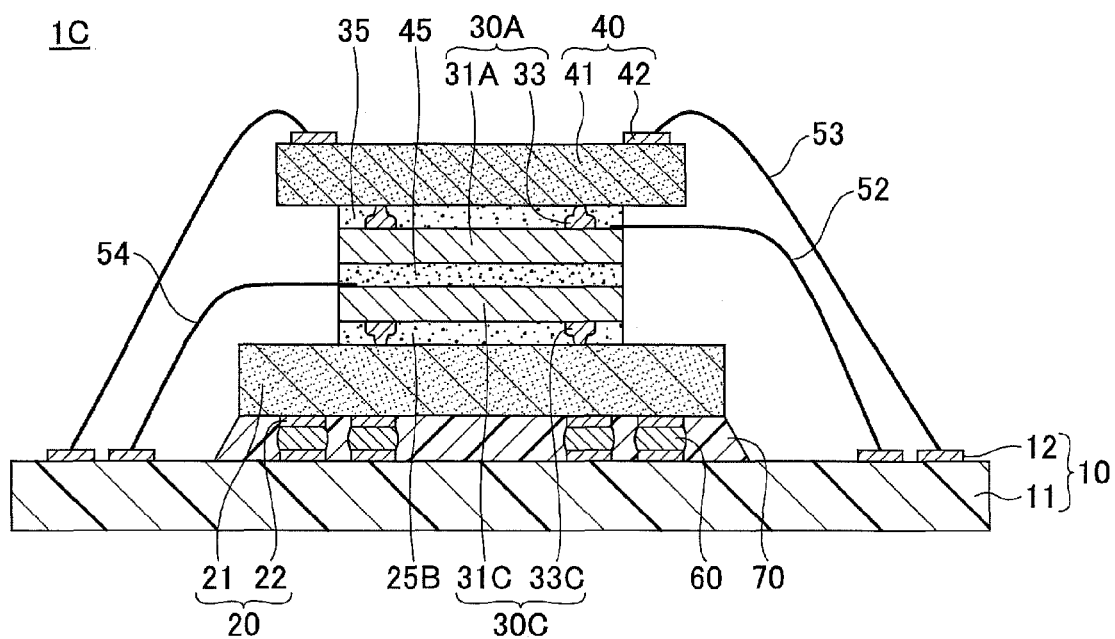
FIG. 7 is a cross-sectional view illustrating an example of a semiconductor device of a third embodiment.

FIG. 7 is a cross-sectional view illustrating an example of a semiconductor device 10 of the third embodiment. With reference to FIG. 7, the semiconductor device 10 of the third embodiment is different from the semiconductor device 1B of the second embodiment (see FIG. 6) in that two relay substrates, the first relay substrate 30A and a second relay substrate 30C, are used.

The second relay substrate 30C is provided between the first semiconductor chip 20 and the first relay substrate 30A, and stacked on the first semiconductor chip 20 through the adhesion layer 25B (third non-conductive adhesion layer). The second relay substrate 30C includes a metal plate 31C and second protruding electrodes 33C that are electrically connected to the metal plate 31C. The material, the shape or the like of the metal plate 31C and the second protruding electrodes 33C may be the same as that of the metal plate 31A and the first protruding electrodes 33, for example. This means that a relay substrate same as the first relay substrate 30A may be used as the second relay substrate 30C. In this embodiment, the metal plate 31C functions as a second conductive portion.

The second relay substrate 30C is stacked on the first semiconductor chip 20 through the adhesion layer 25B such as to face the second protruding electrodes 33C toward the back surface of the first semiconductor chip 20 side. The first relay substrate 30A is stacked on the second relay substrate 30C through an adhesion layer 45 (first non-conductive adhesion layer) such as to face the first protruding electrodes 33 toward the back surface of the second semiconductor chip 40 side. A surface of the metal plate 31C at the adhesion layer 45 side is connected to a bonding pad (second pad) of the wiring layer 12 through a bonding wire 54 (second metal wire). The bonding wire 54 may be a metal wire made of gold (Au), copper (Cu), aluminum (Al) or the like, for example.

It is necessary to configure the first protruding electrodes 33 and the second protruding electrodes 33C not to be electrically connected in order to apply different voltages to the back surface of the second semiconductor chip 40 and the back surface of the first semiconductor chip 20. This means that it is necessary to insulate the metal plate 31A and the metal plate 31C. Thus, for the adhesion layer 45, a non-conductive adhesion layer obtained by curing a non-conductive adhesive agent is used.

The back surface of the second semiconductor chip 40 contacts the upper end surfaces of the first protruding electrodes 33 of the first relay substrate 30A so that the second semiconductor chip 40 and the first protruding electrodes 33 are electrically connected with each other. This means that it is possible to apply a predetermined voltage to the back surface of the second semiconductor chip 40 from the wiring layer 12 of the support body 10 through the bonding wire 52, the metal plate 31A and the first protruding electrodes 33. Further, the back surface of the first semiconductor chip 20 contacts the lower end surfaces of the second protruding electrodes 33C of the second relay substrate 30C so that the first semiconductor chip 20 and the second protruding electrodes 33C are electrically connected with each other. This means that it is possible to apply a predetermined voltage to the back surface of the first semiconductor chip 20 from the wiring layer 12 of the support body 10 through the bonding wire 54, the metal plate 31C and the second protruding electrodes 33C.

The bonding pads of the wiring layer 12 to which the bonding wires 52 and 54 are respectively connected are insulated from each other. Thus, it is possible to apply different voltages (ground potential, power supply potential or the like) to the second semiconductor chip 40 and the first semiconductor chip 20 through the bonding wires 52 and 54, respectively. In other words, a voltage different from that applied to the back surface of the second semiconductor chip 40 can be applied to the back surface of the first semiconductor chip 20.

In this embodiment, as the back surface of the second semiconductor chip 40 contacts the upper end surfaces of the first protruding electrodes 33 so that the predetermined voltage can be applied to the back surface of the second semiconductor chip 40 through the first protruding electrodes 33. Further, as the back surface of the first semiconductor chip 20 contacts the lower end surfaces of the second protruding electrodes 33C so that the predetermined voltage can be applied to the back surface of the first semiconductor chip 20 through the first protruding electrodes 33C. Thus, similar to the second embodiment, it is unnecessary to make the adhesion layers 35 and 25B conductive.

As such, in this embodiment, as non-conductive adhesive agent can be used as the adhesion layers 35 and 25B, without using electrically conductive adhesive agent, the same advantages as the first embodiment can be obtained.

According to the embodiments, a semiconductor device in which a back surface of a semiconductor chip can be fixed at predetermined potential without using a conductive adhesive agent can be provided.

Although a preferred embodiment of the semiconductor device has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

What is claimed is:

1. A semiconductor device comprising:
a support body provided with a wiring layer that includes a first pad;
a first semiconductor chip stacked on the support body;
a first relay substrate stacked on the first semiconductor chip through a first non-conductive adhesion layer and including a first conductive portion and a first protruding electrode that is electrically connected to the first conductive portion;
a second semiconductor chip, provided with a circuit forming surface on which a circuit is formed and a non-circuit forming surface opposite to the circuit forming surface, stacked on one surface of the first relay substrate through a second non-conductive adhesion layer such that the non-circuit forming surface faces the first relay substrate,
the first protruding electrode of the first relay substrate penetrating the second non-conductive adhesion layer to be connected to the non-circuit forming surface of the second semiconductor chip; and
a first metal wire formed at the one surface of the first relay substrate to be connected to the first conductive portion for electrically connecting the first conductive portion with the first pad of the wiring layer of the support body.

2. The semiconductor device according to claim 1, wherein the first semiconductor chip is provided with a circuit forming surface on which a circuit is formed and a non-circuit forming surface opposite to the circuit forming surface and is stacked on the support body such that the circuit forming surface faces the support body, and
wherein the first relay substrate further includes a second protruding electrode that is electrically connected to the first conductive portion and penetrates the first non-conductive adhesion layer to be connected to the non-circuit forming surface of the first semiconductor chip.

3. The semiconductor device according to claim 2, wherein the first relay substrate includes a base member made of resin, and
wherein the first conductive portion includes
conductive layers formed at both surfaces of the base member and
a through electrode formed in the base member to electrically connect the conductive layers formed at the both surfaces of the base member.

4. The semiconductor device according to claim 1, wherein the first semiconductor chip is provided with a circuit forming surface on which a circuit is formed and a non-circuit forming surface opposite to the circuit forming surface and is stacked on the support body such that the circuit forming surface faces the support body, and
wherein the wiring layer of the support body further includes a second pad kept at potential different from potential of the first pad,
the semiconductor device further comprising:
a second relay substrate provided between the first semiconductor chip and the first relay substrate, and stacked on the first semiconductor chip through a third non-conductive adhesion layer such that the first relay substrate is stacked on one surface of the second relay substrate through the first non-conductive adhesion layer,
the second relay substrate including
a second conductive portion that is insulated from the first conductive portion of the first relay substrate, and
a second protruding electrode that is electrically connected to the second conductive portion, penetrates the third non-conductive adhesion layer and contacts the non-circuit forming surface of the first semiconductor chip to be electrically connected to the first semiconductor chip, and a second metal wire connected to the second conductive portion for electrically connecting the second conductive portion with the second pad of the wiring layer of the support body.

5. The semiconductor device according to claim 1,
wherein the first relay substrate includes a base member made of resin, and
wherein the first conductive portion includes a conductive layer formed at one surface of the base member that faces the second semiconductor chip.

6. The semiconductor device according to claim 1,
wherein the entirety of the one surface of the first relay substrate is configured to be conductive and the first protruding electrode is provided at the one surface of the first relay substrate.

7. The semiconductor device according to claim 1,
wherein the first protruding electrode is a bump including a larger portion at which the diameter is larger and a smaller portion at which the diameter is smaller, the larger portion side being connected to the first relay substrate and the smaller portion side being connected to the second semiconductor chip.

8. The semiconductor device according to claim 1,
wherein a plan shape of the second semiconductor chip is larger than a plan shape of the first relay substrate.

* * * * *